(12) United States Patent
Naito et al.

(10) Patent No.: US 8,017,871 B2
(45) Date of Patent: Sep. 13, 2011

(54) WIRED CIRCUIT BOARD ASSEMBLY SHEET

(75) Inventors: Toshiki Naito, Osaka (JP); Tetsuya Ohsawa, Osaka (JP); Kouji Kataoka, Osaka (JP)

(73) Assignee: Nitto Denko Corporation, Osaka (JP)

( * ) Notice: Subject to any disclaimer, the term of this patent is extended or adjusted under 35 U.S.C. 154(b) by 156 days.

(21) Appl. No.: 12/457,874

(22) Filed: Jun. 24, 2009

(65) Prior Publication Data

US 2009/0260855 A1 Oct. 22, 2009

Related U.S. Application Data

(63) Continuation of application No. 11/783,999, filed on Apr. 13, 2007, now Pat. No. 7,592,551.

(30) Foreign Application Priority Data

Apr. 13, 2006 (JP) ................................. 2006-111163

(51) Int. Cl.
*H05K 1/00* (2006.01)

(52) U.S. Cl. ........ 174/250; 174/255; 174/256; 174/257; 174/260; 174/261; 29/832; 29/833; 29/834; 29/705; 29/710; 438/15; 438/125; 257/700

(58) Field of Classification Search .................. 174/250, 174/255–257, 260, 261; 29/832–834, 705–710; 438/15, 125; 257/700

See application file for complete search history.

(56) References Cited

U.S. PATENT DOCUMENTS

| | | | |
|---|---|---|---|
| 3,766,761 A | 10/1973 | Adair et al. | |
| 4,419,803 A | 12/1983 | Thornton et al. | |
| 4,437,229 A | 3/1984 | Bitler et al. | |
| 4,787,143 A * | 11/1988 | Yagi et al. | 29/833 |
| 5,049,813 A | 9/1991 | Van Loan et al. | |
| 5,115,141 A | 5/1992 | Gold | |
| 5,225,286 A * | 7/1993 | Fujikawa et al. | 428/426 |
| 5,285,436 A | 2/1994 | Moribe | |
| 5,937,512 A * | 8/1999 | Lake et al. | 29/832 |
| 5,953,447 A * | 9/1999 | Jin | 382/145 |
| 6,365,841 B1 * | 4/2002 | Takigami | 174/260 |
| 6,852,553 B2 | 2/2005 | Ishizu et al. | |
| 6,937,004 B2 * | 8/2005 | Ohazama | 324/750.18 |
| 6,938,335 B2 * | 9/2005 | Kuribayashi et al. | 29/834 |
| 6,946,306 B2 * | 9/2005 | Ishizu et al. | 438/15 |
| 7,081,590 B2 | 7/2006 | Yuzawa | |
| 7,402,755 B2 | 7/2008 | Chen et al. | |
| 2001/0008442 A1 * | 7/2001 | Miyake | 355/53 |
| 2002/0015129 A1 | 2/2002 | Hasegawa et al. | |
| 2003/0088261 A1 | 5/2003 | Schraga | |
| 2004/0207069 A1 * | 10/2004 | Naito et al. | 257/700 |
| 2004/0249920 A1 | 12/2004 | Ogasawara et al. | |
| 2005/0018977 A1 | 1/2005 | Beer et al. | |

(Continued)

FOREIGN PATENT DOCUMENTS

JP 61-158191 7/1986

(Continued)

*Primary Examiner* — Xiaoliang Chen

(74) *Attorney, Agent, or Firm* — Jean C. Edwards, Esq.; Edwards Neils PLLC

(57) ABSTRACT

A wired circuit board assembly sheet has a plurality of wired circuit boards, distinguishing marks for distinguishing defectiveness of the wired circuit boards, and a supporting sheet for supporting the plurality of wired circuit boards and the distinguishing marks. Each of the distinguishing marks has an indication portion for indicating a specified one of the wired circuit boards.

4 Claims, 8 Drawing Sheets

U.S. PATENT DOCUMENTS

| | | |
|---|---|---|
| 2005/0050401 A1 | 3/2005 | Matsuki et al. |
| 2005/0149667 A1 | 7/2005 | Nakayama et al. |
| 2005/0205642 A1 | 9/2005 | Kim |
| 2005/0247481 A1 | 11/2005 | Chen et al. |
| 2005/0250254 A1 | 11/2005 | Ishizu et al. |
| 2007/0059991 A1* | 3/2007 | Chikazawa et al. ............ 439/751 |
| 2007/0077011 A1* | 4/2007 | Whitehead ....................... 385/88 |
| 2007/0170911 A1* | 7/2007 | Ohsawa et al. ............ 324/158.1 |

FOREIGN PATENT DOCUMENTS

| | | |
|---|---|---|
| JP | 63-073964 | 5/1988 |
| JP | 06-244540 | 9/1994 |
| JP | 08-056062 | 2/1996 |
| JP | 09-214080 | 8/1997 |
| JP | 2000-151044 | 5/2000 |
| JP | 2001-127399 | 5/2001 |
| JP | 2001-168478 | 6/2001 |
| JP | 2002-329813 | 11/2002 |
| JP | 2004-039056 | 2/2004 |

* cited by examiner (a)

(b)

(c)

(d)

WIRED CIRCUIT BOARD ASSEMBLY SHEET

CROSS-REFERENCE TO RELATED APPLICATIONS

The present application is a continuation of U.S. patent application Ser. No. 11/783,999, filed Apr. 13, 2007, now U.S. Pat. No. 7,592,551 which claims priority from Japanese Patent Application No. 2006-111163 filed on Apr. 13, 2006, the contents of which are hereby incorporated by reference into this application in their entirety.

BACKGROUND OF THE INVENTION

1. Field of the Invention

The present invention relates to a wired circuit board assembly sheet in which a plurality of wired circuit boards are formed.

2. Description of Related Art

A wired circuit board typically comprises an insulating base layer, a conductive pattern formed on the insulating base layer, and an insulating cover layer formed on the insulating base layer to cover the conductive pattern. Such a wired circuit board is produced as a wired circuit board assembly sheet in which, e.g., a plurality of wired circuit boards are formed on a single metal supporting board.

More specifically, in the production of the wired circuit board assembly sheet, the insulating base layer, the conductive pattern, and the insulating cover layer are successively formed in an aligned state on the single metal supporting board to correspond to each of the individual wired circuit boards. Then, the metal supporting board is partially cut out such that the cut-out portion corresponds to an outer shape of each wired circuit board, whereby each of the wired circuit boards and the supporting sheet for supporting each wired circuit board are formed. In this manner, the wired circuit boards are produced as the wired circuit board assembly sheet in which the plurality of wired circuit boards are provided in an aligned state on the single metal supporting board.

Then, each of the wired circuit boards is appropriately cut away from the wired circuit board assembly sheet described above for wide use in various electric equipment and electronic equipment.

In such a wired circuit board assembly sheet, it has been known to provide a defectiveness distinguishing mark corresponding to each wired circuit board for distinguishing defectiveness.

For example, it has been proposed to distinguish whether a circuit board is defective or not by removing an alignment mark serving as a reference for aligning an electronic component or the like with laser processing to recognize the presence or absence of the alignment mark using an automatic image recognition device (see, e.g., Japanese Unexamined Patent Publication No. 2001-127399).

SUMMARY OF THE INVENTION

In the wired circuit boards disclosed in Japanese Unexamined Patent Publication No. 2001-127399, a circular alignment mark is formed on the corner portion of a wired circuit board region in which the wired circuit board is formed.

To improve the productivity of the wired circuit board and reduce the production cost thereof, it is necessary to arrange the wired circuit boards at a high density in a single wired circuit board assembly sheet. However, in the wired circuit board assembly sheet in which the wired circuit boards are arranged at a high density, the region in which the defect-distinguishing mark can be formed is small so that the plurality of wired circuit boards are in close proximity to one of the defect-distinguishing marks. In such a case of the circular alignment marks disclosed in Japanese Unexamined Patent Publication No. 2001-127399, it is difficult to identify the wired circuit board to which each alignment mark corresponds.

It is therefore an object of the present invention to provide a wired circuit board assembly sheet in which, when the defectiveness of the wired circuit board is distinguished, the wired circuit board corresponding to each of the distinguishing marks can be easily identified.

A wired circuit board assembly sheet according to the present invention comprises a plurality of wired circuit boards, distinguishing marks for distinguishing defectiveness of the wired circuit boards, and a supporting sheet for supporting the plurality of wired circuit boards and the distinguishing marks, wherein each of the distinguishing marks comprises an indication portion for indicating a specified wired circuit boards.

In the wired circuit board assembly sheet according to the present invention, each of the distinguishing marks for distinguishing defectiveness of the wired circuit boards comprises the indication portion for indicating the specified wired circuit board. Accordingly, when the distinguishing marks are formed in the wired circuit board assembly sheet, it is possible to distinctly represent the correspondence between the distinguishing mark and the specified wired circuit board by directing the indication direction of the indication portion toward the specified wired circuit board. As a result, even when the density of the wired circuit boards is high and the plurality of wired circuit boards are in close proximity to one of the distinguishing marks, or the plurality of distinguishing marks are adjacent to each other, the wired circuit board corresponding to each of the distinguishing marks can be easily identified.

In the wired circuit board assembly sheet according to the present invention, it is preferable that each of the distinguishing marks is formed in a non-point-symmetrical shape.

When each of the distinguishing marks has a non-point-symmetrical shape, even in the case where the distinguishing mark is formed with a plurality of portions (quasi-indication portions) which can function as the indication portions, it is possible to prevent directions (quasi-indication directions) which may possibly be the respective indication directions of the quasi-indication portions from overlapping on the same straight line. Accordingly, even when the two wired circuit boards are formed in adjacent relation to the distinguishing mark, it is possible to prevent each of the quasi-indication directions from being directed toward a direction reverse to the indication direction. As a result, it is less likely to misidentify the specified wired circuit board corresponding to each of the distinguishing marks as another wired circuit board. This makes it possible to easily and reliably identify the wired circuit board corresponding to each of the distinguishing marks.

In the wired circuit board assembly sheet according to the present invention, it is preferable that the indication portion has a shape tapered toward an indication direction indicating the specified wired circuit board.

When each of the indication portions has a shape tapered toward the indication direction indicating the specified wired circuit board, the indication portion can distinctly represent the indication direction. This allows easy identification of the wired circuit board corresponding to each of the distinguishing marks.

In the wired circuit board assembly sheet according to the present invention, it is preferable that each of the distinguishing marks has a generally polygonal shape having an odd number of angles.

When each of the distinguishing marks has a generally polygonal shape having an odd number of angles, it is possible to use an arbitrary portion including any of the angles as the indication portion and indicate the specified wired circuit board with the indication portion. In addition, because each of the distinguishing marks has a generally polygonal simple shape, the distinguishing marks can be formed easily.

In the wired circuit board assembly sheet according to the present invention, it is preferable that the distinguishing marks are arranged in mutually adjacent relation and the indication portions of the distinguishing marks arranged in adjacent relation have respective indication directions different from each other.

When the distinguishing marks are arranged in mutually adjacent relation and the indication portions of the distinguishing marks have the respective indication directions different from each other, it is less likely to confuse, in identifying the wired circuit board corresponding to each of the distinguishing marks, the corresponding wired circuit board with another wired circuit board. This allows easy identification of the wired circuit board corresponding to each of the distinguishing marks.

In the wired circuit board assembly sheet according to the present invention, it is preferable that the supporting sheet has openings formed in the portions where the distinguishing marks are formed and each of the distinguishing marks comprises a removal portion disposed in the opening for indicating whether the corresponding wired circuit board is defective or non-defective; and a joint portion made of a resin for jointing the removal portion to the supporting sheet.

When the supporting sheet has the openings formed in the portions where the distinguishing marks are formed and each of the distinguishing marks comprises the removal portion for indicating whether the corresponding wired circuit board is defective or non-defective and the joint portion made of a resin for jointing the removal portion to the supporting sheet, the removal portion can be easily removed from the supporting sheet by cutting the joint portion to show whether the wired circuit board is defective or non-defective. Because the joint portion is made of a resin, there is no production of metal powder or the like even when the joint portion is cut so that the wired circuit board is allowed to retain its excellent electric characteristics. Even when punching is performed with a stamping die, the abrasion of the stamping die can be reduced. As a result, it is possible to easily and reliably remove the removal portion to provide the wired circuit board with high connection reliability.

DESCRIPTION OF THE PREFERRED EMBODIMENTS

Figure 1:
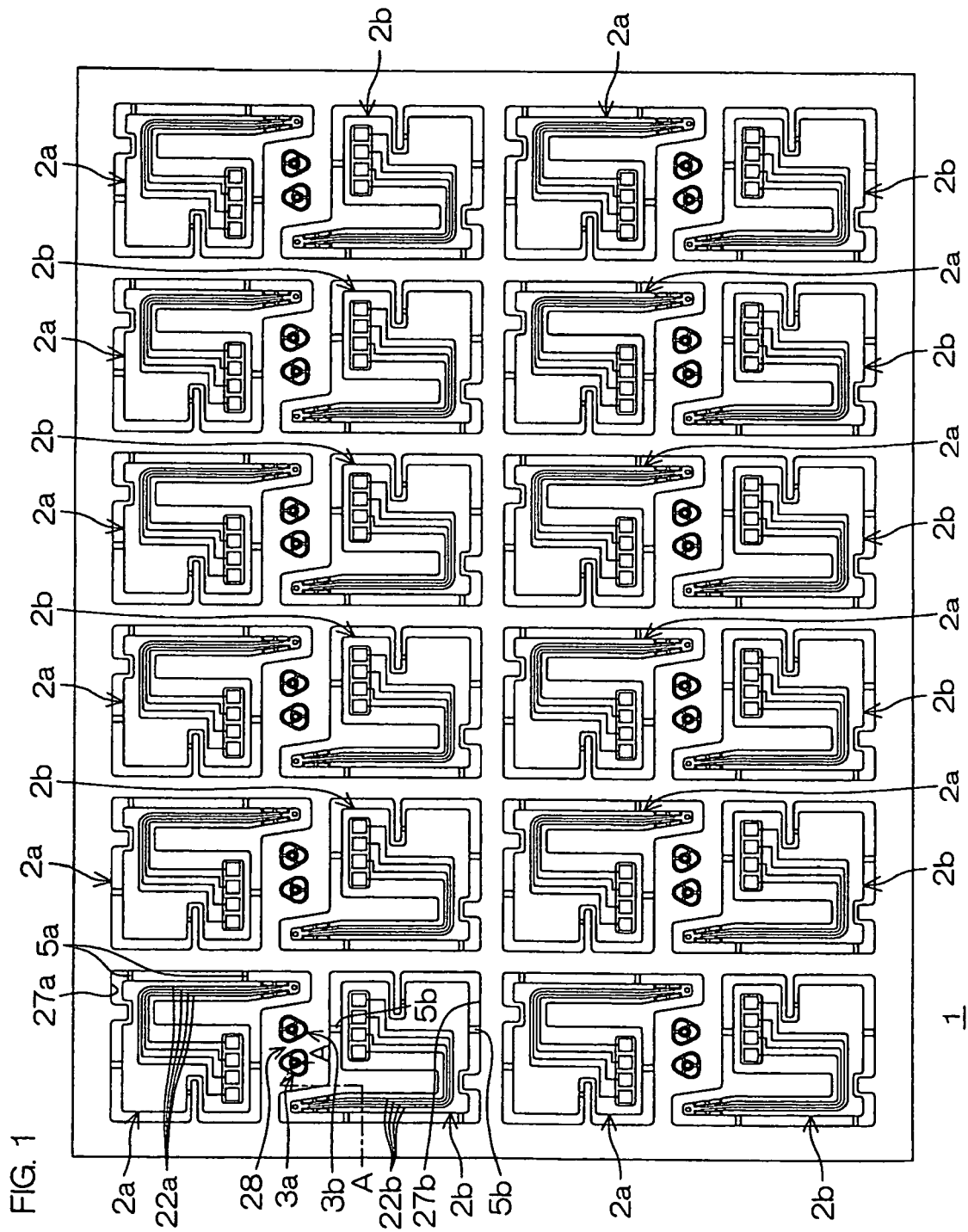
FIG. 1 is a plan view showing a wired circuit board assembly sheet according to an embodiment of the present invention.
Figure 2:
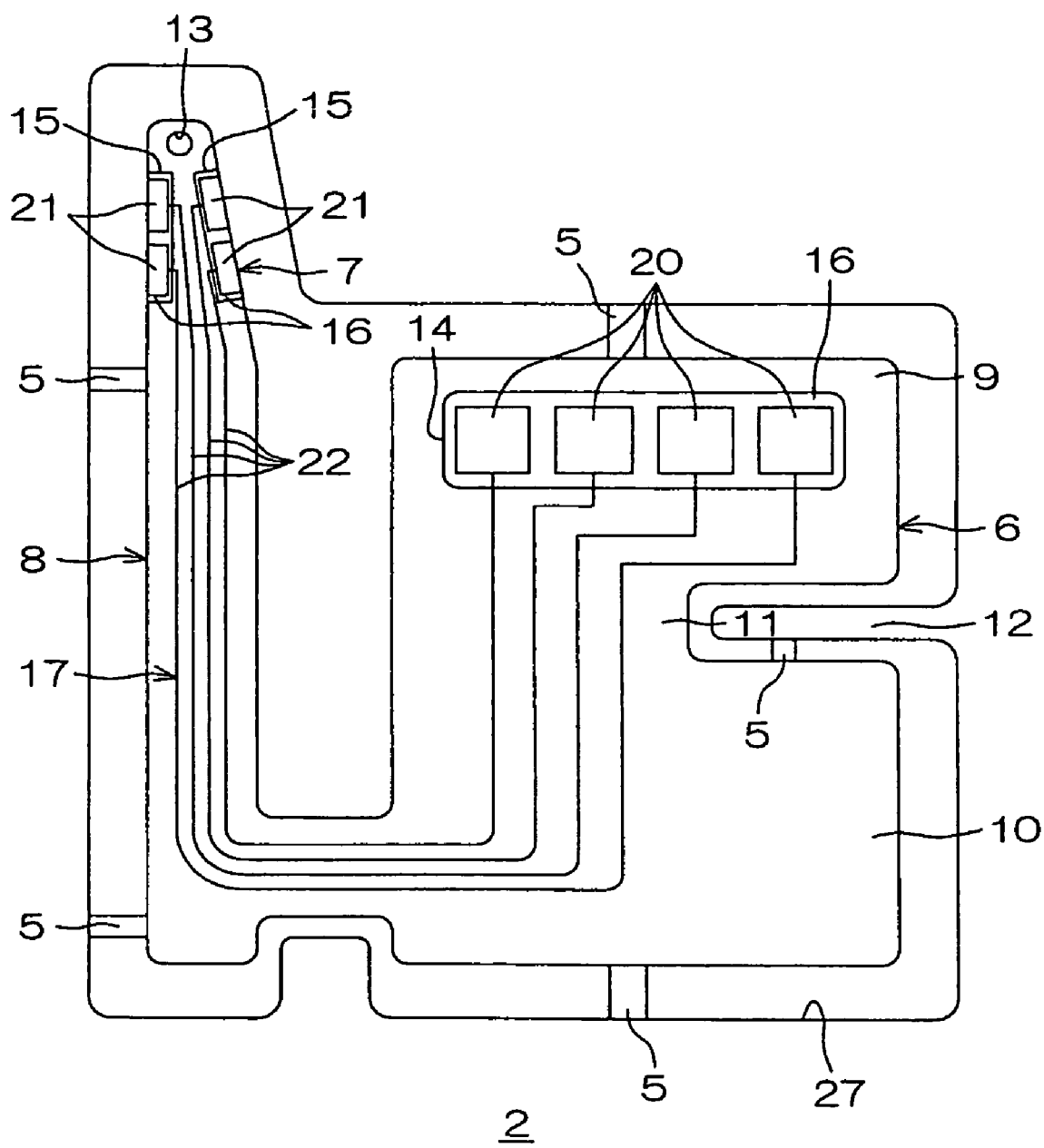
FIG. 2 is a plan view of a wired circuit board shown in FIG. 1.
Figure 3:
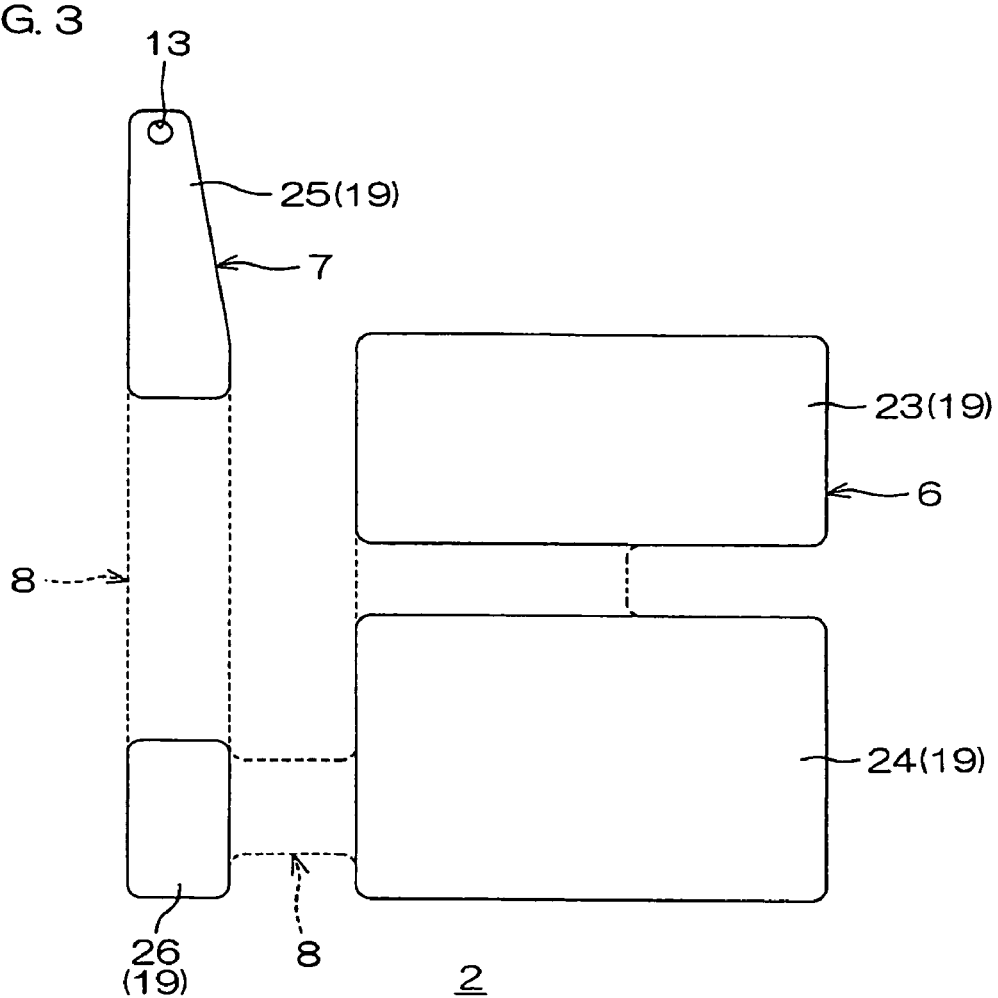
FIG. 3 is a bottom view showing a placement of a metal supporting layer in the wire circuit board shown in FIG. 2.
Figure 4:
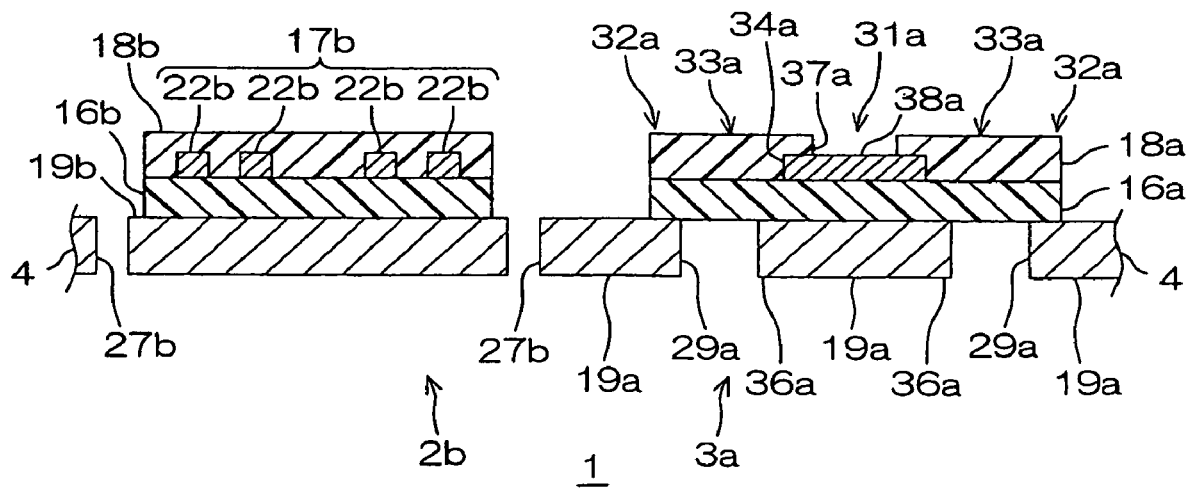
FIG. 4 is a cross-sectional view taken along the line A-A of the wire circuit board assembly sheet shown in FIG. 1.
Figure 5:
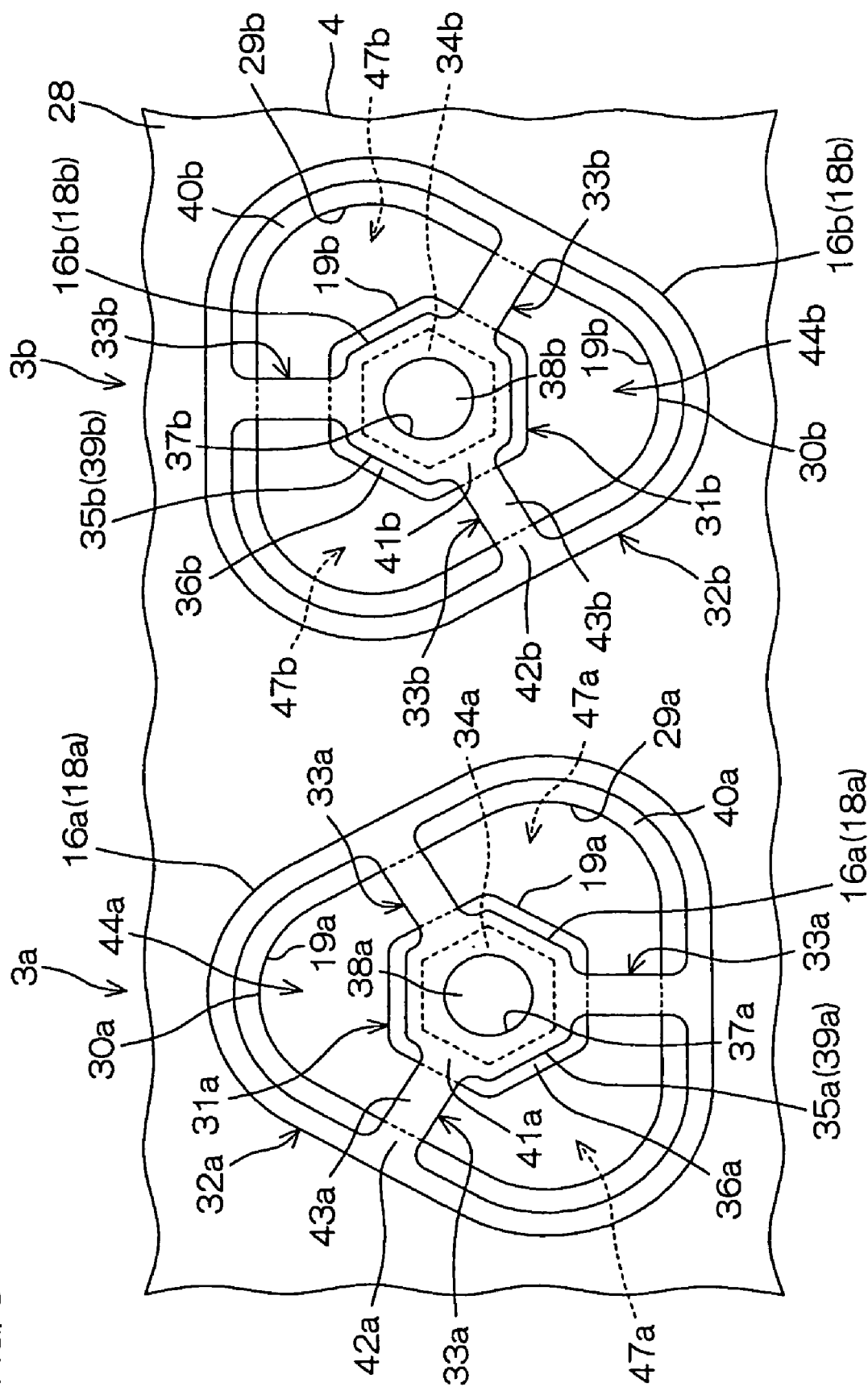
FIG. 5 is an enlarged plan view of a distinguishing mark formation region formed in the wired circuit board assembly sheet shown in FIG. 1.

FIG. 1 is a plan view showing a wired circuit board assembly sheet according to an embodiment of the present invention. FIG. 2 is a plan view of one of the wired circuit boards shown in FIG. 1. FIG. 3 is a bottom view showing a placement of a metal supporting layer in the wire circuit board shown in FIG. 2. FIG. 4 is a cross-sectional view taken along the line A-A of the wire circuit board assembly sheet shown in FIG. 1. FIG. 5 is an enlarged plan view of a distinguishing mark formation region formed in the wired circuit board assembly sheet shown in FIG. 1. In FIG. 1, an insulating base layer 16 and an insulating cover layer 18, described later are omitted.

In FIG. 1, a wired circuit board assembly sheet 1 comprises a plurality of wired circuit boards 2, distinguishing marks 3, and a supporting sheet 4 for supporting the plurality of wired circuit boards 2 and the distinguishing marks 3.

In the supporting sheet 4, the respective wired circuit boards 2 are provided in pairs. More specifically, the pair of the wired circuit boards 2 includes one wired circuit board 2a formed at a relatively upper position and the other wired circuit board 2b formed at a relatively lower position, each placed in mutually spaced-apart facing relation in the vertical direction of FIG. 1. The pairs of the wired circuit boards 2 are arranged in mutually spaced-apart aligned relation and supported by the supporting sheet 4 via cuttable supporting portions 5. In the following description, for the purpose of identification, each of the components of the one wired circuit board 2a is denoted by adding "a" at the end of a reference numeral, while each of the components of the other wired circuit board 2b is denoted by adding "b" at the end of a reference numeral.

In FIG. 2, the wired circuit board 2 is a flexible wired circuit board formed in a generally U-shape when viewed in plan view, which integrally comprises a first connecting portion 6 for connecting to a connector or the like, a second connecting portion 7 for connecting to an external terminal or the like, and a flat-plate wiring portion 8 coupling the first connecting portion 6 to the second connecting portion 7.

The first connecting portion 6 has a generally rectangular shape when viewed in plan view and comprises a terminal region 9 formed on a relatively upper side in the vertical direction of FIG. 2, a wiring region 10 disposed below the terminal region 9 in facing relation thereto, and a coupling region 11 for coupling the terminal region 9 to the wiring region 10 extending from the widthwise left end portion of the first connecting portion 6 to the generally middle portion thereof. The portion between the terminal region 9 and the wiring region 10 of the first connecting portion 6 extending from the generally middle portion to the right end portion in the widthwise direction thereof, i.e., the portion in which the coupling region 11 is not formed is formed as a groove region 12.

The terminal region 9 has a first terminal portion 14 formed with a plurality of first terminals 20 (described later) each electrically connected to a connector or the like. The first terminal portion 14 is provided in the shape of an elongated rectangle when viewed in plan view at the rear end portion (front and rear sides respectively correspond to one side and the other side in a direction in which wires 22 described later extend) of the terminal region 9 along the widthwise direction (widthwise direction corresponds to a direction orthogonal to the extending direction (front-to-rear direction) of the wires 22 described later).

The second connecting portion 7 is formed in a generally rectangular shape of which the front end portion is tapered and comprises second terminal portions 15 formed with a plurality of second terminals 21 (described later) each electrically connected to an external circuit or the like. The second terminal portions 15 are provided on the both side end portions in the widthwise direction of the second connecting portion 7 along the front-to-rear direction. The second connecting portion 7 has a fixing hole 13 formed in the front end portion thereof to extend therethrough.

The flat-plate wiring portion 8 has a generally L-shape when viewed in plan view and is provided between the widthwise left end of the first connecting portion 6 (wiring region 10) and the rear end of the second connecting portion 7 to couple therebetween.

As shown in FIG. 4, the wired circuit board 2 also comprises an insulating base layer 16, a conductive pattern 17 formed on the surface of the insulating base layer 16, and an insulating cover layer 18 formed on the insulating base layer 16 to cover the surface of the conductive pattern 17. In addition, the wired circuit board 2 comprises a metal supporting layer 19 partially formed on the back surface of the insulating base layer 16 (see FIG. 3).

As shown in FIG. 2, the insulating base layer 16 is formed in a pattern having the basic shape of the wired circuit board 2, i.e., a generally U-shape when viewed in plan view.

The insulating base layer 16 is formed of a film of a synthetic resin such as, e.g., a polyimide resin, an acrylic resin, a polyether nitrile resin, a polyether sulfone resin, a polyethylene terephthalate resin, a polyethylene naphthalate resin, or a polyvinyl chloride resin. As the synthetic resin, a photosensitive synthetic resin is preferably used, or more preferably a photosensitive polyimide resin is used.

The thickness of the insulating base layer 16 is in the range of, e.g., 5 to 25 µm, or preferably 7 to 15 µm.

As shown in FIG. 2, the conductive pattern 17 is formed continuously over the first connecting portion 6, the flat-plate wiring portion 8, and the second connecting portion 7. The conductive pattern 17 integrally comprises the plurality of first terminals 20, the plurality of second terminals 21, and the plurality of wires 22 connecting the first terminals 20 and the second terminals 21 respectively.

Each of the first terminals 20 is in the form of a quadrilateral land and provided on the first terminal portion 14 of the first connecting portion 6 (terminal region 9) in mutually spaced-apart relation along the widthwise direction. Each of the first terminals 20 is not limited to the quadrilateral land and may also be a round land.

Each of the second terminals 21 is in the form of a quadrilateral land and provided on each of the second terminal portions 15 provided on the both side end portions in the widthwise direction of the second connecting portion 7 in mutually spaced-apart relation along the front-to-rear direction. Each of the second terminals 21 is not limited to the quadrilateral land and may also be a round land.

The wires 22 are arranged over the first connecting portion 6, the flat-plate wiring portion 8, and the second connecting portion 7 in mutually spaced-apart parallel relation in the widthwise direction. The wires 22 are provided to individually connect the first terminals 20 to the second terminals 21, respectively.

The conductive pattern 17 is formed of a conductive foil (metal foil) made of, e.g., copper, nickel, gold, a solder, an alloy thereof, or the like. In terms of conductivity, inexpensiveness, and workability, a copper foil is preferably used.

The conductive pattern 17 has a thickness in the range of, e.g., 5 to 35 µm, or preferably 7 to 18 µm. Each of the wires 22 has a width in the range of, e.g. 25 to 150 µm, or preferably 30 to 100 µm at the flat-plate wiring portion 8. The spacing between the wires 22 is in the range of, e.g., 25 to 150 µm, or preferably 30 to 100 µm at the flat-plate wiring portion 8.

The insulating cover layer 18 is formed in a pattern having a substantially identical shape to the insulating base layer 16.

The insulating cover layer 18 has openings formed to expose the first terminals 20 and the second terminals 21. These opening portions form the first terminal portions 14 and the second terminal portions 15.

For the insulating cover layer 18, a film of a synthetic resin, which is the same for the insulating base layer 16 described above, is used. As the synthetic resin, a photosensitive polyimide resin is preferably used. The thickness of the insulating cover layer 18 is in the range of, e.g., 3 to 25 µm, or preferably 4 to 15 µm.

The metal supporting layer 19 is formed of a metal supporting board 45 (see FIG. 6(a)) together with the supporting sheet 4 described later. As shown in FIG. 3, the metal supporting layer 19 is formed of separate thin plates at the first connecting portion 6 (terminal region 9 and wiring region 10), at the flat-plate wiring portion 8, and at the second connecting portion 7.

At the first connecting portion 6, the metal supporting layer 19 is provided on the back surface of the insulating base layer 16 to serve as a first reinforcing plate 23 for reinforcing the terminal region 9 formed with the first terminal portions 14 and as a second reinforcing plate 24 for reinforcing the wiring region 10. At the second connecting portion 7, the metal supporting layer 19 is provided over the entire back surface of the insulating base layer 16 of the second connecting portion 7 to serve as a third reinforcing plate 25 for reinforcing the second terminal portions 15. At the flat-plate wiring portion 8, the metal supporting layer 19 is provided at the bent portion of the flat-wire surface 8 on the back surface of the insulating base layer 16 in a generally L-shape to serve as a generally rectangular fourth reinforcing plate 26 for reinforcing the bent portion.

In the wired circuit board 2, by thus placing the metal supporting layer 19, flexibility is imparted to the region (coupling region 11) between the terminal region 9 and the wiring region 10 in the first connecting portion 6, to the region between the first connecting portion 6 and the bent portion of the flat-plate wiring portion 8, and to the region between the second connecting portion 7 and the bent portion of the flat-plate wiring portion 8.

The metal supporting layer 19 is formed of a sheet of a metal such as, e.g., stainless steel, 42-alloy, or copper. As the metal, stainless steel is preferably used. The thickness of the metal supporting layer 19 is in the range of, e.g., 25 to 200 µm, or preferably 50 to 100 µm.

As shown in FIGS. 1 and 4, the supporting sheet 4 is formed together with each of supporting portions 5 and each of the metal supporting layers 19 by partially cutting out the metal supporting board 45 (see FIGS. 6 and 7) such that the cut-out portions correspond to the respective outer configurations of the wired circuit boards 2 in a method for producing the wired circuit board assembly sheet 1 described later.

The supporting sheet 4 has clearance grooves 27 between the inner peripheral portions of the supporting sheet 4 surrounding the individual wired circuit boards 2 and the respective outer peripheral portions of the wired circuit boards 2, which are formed in generally frame-like shapes when viewed in plan view to surround the individual wired circuit boards 2. The width of each of the clearance grooves 27 is normally set in the range of 0.5 to 1.0 mm.

The supporting sheet 4 also has the plurality of supporting portions 5 formed to traverse the clearance grooves 27. Each of the supporting portions 5 is in a generally rectangular shape when viewed in plan view and formed to extend from the inner peripheral portion of the supporting sheet 4, orthogonally pass over the clearance groove 27, and reach the outer peripheral portion of the wired circuit board 2. The width of the supporting portions 5 is normally set in the range of 0.2 to 2.0 µm, or preferably 0.3 to 1.0 µm. The number of the supporting portions 5 and the positions thereof at which they are formed can be determined appropriately in accordance with the size, shape, and the like of the wired circuit board 2.

The supporting sheet 4 has a distinguishing mark formation region 28 formed on which the distinguishing marks 3 are provided.

The distinguishing mark formation region 28 is provided in one-to-one relation to one pair of the wired circuit boards 2 (the one wired circuit board 2a and the other wired circuit board 2b) arranged in facing relation such to interpose between the one wired circuit board 2a and the other wired circuit board 2b. As shown in FIG. 5, the distinguishing mark formation region 28 is formed with two openings 29, more specifically the one opening 29a on the left-hand side in the lateral direction of each of FIGS. 1 and 5 and the other opening 29b on the right-hand side in the lateral direction.

The opening 29 is in a generally equilaterally triangular shape with curved angles when viewed in plan view and formed to extend through the supporting sheet 4 in the thickness direction. Specifically, the opening 29 is formed such that an indication vertex 30a, which is an arbitrary angle of the one opening 29a, faces the one wired circuit board 2a and that an indication vertex 30b, which is an arbitrary angle of the other opening 29b, faces the other wired circuit board 2b. One side (linear portion) of the opening 29 has a length set to, e.g., 400 µm, or preferably 200 µm.

The distinguishing mark 3 is for distinguishing defectiveness of the wired circuit board 2. The distinguishing mark 3 is provided as one distinguishing mark 3a and the other distinguishing mark 3b in the distinguishing mark formation region 28, specifically provided respectively in the one opening 29a and the other opening 29b. In the following description, for the purpose of identification, each of the components of the one distinguishing mark 3a is denoted by adding "a" at the end of a reference numeral, while each of the components of the other distinguishing mark 3b is denoted by adding "b" at the end of a reference numeral.

The distinguishing mark 3 comprises a removal portion 31, an outer frame portion 32, and joint portions 33.

The removal portion 31 is for indicating that the corresponding wired circuit board 2 is non-defective and disposed generally at the center of the opening 29. When viewed in plan view, the removal portion 31 is formed in a generally equilaterally hexagonal shape having curved angles, which is slightly smaller in size than the opening 29.

As shown in FIG. 4, the removal portion 31 comprises a metal supporting layer 19, an insulating base layer 16 formed on the metal supporting layer 19, a mark formation portion 34 formed on the insulating base layer 16, and an insulating cover layer 18 formed on the insulating base layer 16 to cover a part of the mark formation portion 34.

As shown in FIG. 5, the metal supporting layer 19 of the removal portion 31 is formed in a shape corresponding to the outer shape of the removal portion 31, i.e., the generally equilaterally hexagonal shape having curved angles.

The insulating base layer 16 of the removal portion 31 is formed on the metal supporting layer 19 to have a generally equilaterally hexagonal shape having curved angles when viewed in plan view, which is generally analogous to and slightly smaller in size than the metal supporting layer 19. As a result, the peripheral end portion 36 of the metal supporting layer 19 is exposed from an insulating-base-layer outer peripheral surface 35, which is the outer peripheral surface of the insulating base layer 16, except for the joint portions 33 described later.

The mark formation portion 34 is formed on the insulating base layer 16 to have a generally equilaterally hexagonal shape having curved angles when viewed in plan view, which is generally analogous to and slightly smaller in size than the insulating base layer 16. The mark formation portion 34 has a non-defective mark 38 provided integrally at the center thereof when viewed in plan view and exposed from an insulating-cover-layer opening 37 described later. On the surface of the non-defective mark 38, a metal plating layer (not shown) made of gold or the like is formed. In the distinguishing mark 3, a direction from the center of the non-defective mark 38 toward the indication vertex 30 is an indication direction.

As shown in FIG. 4, the insulating cover layer 18 of the removal portion 31 is formed on the insulating base layer 16 to cover the mark formation portion 34 and expose the non-defective mark 38. As shown in FIG. 5, the insulating cover layer 18 is formed to have a generally equilateral hexagonal shape having curved angles when viewed in plan view, which is a generally identical shape of the insulating base layer 16.

As a result, the peripheral end portion 36 of the metal supporting layer 19 is exposed from an insulating-cover-layer outer peripheral surface 39, which is the outer peripheral surface of the insulating cover layer 18, except for the joint portions 33.

The insulating cover layer 18 has the insulating-cover-layer opening 37 formed in a circular shape at the center thereof when viewed in plan view to expose the non-defective mark 38 from the insulating cover layer 18.

In the removal portion 31, the length of one side (linear portion) of the metal supporting layer 19 is set to e.g., 1000 μm, or preferably 600 μm. The length of one side (linear portion) of each of the insulating base layer 16 and the insulating cover layer 18 is set to e.g., 800 μm, or preferably 550 μm. The length of one side (linear portion) of the mark formation portion 34 is set to e.g., 750 μm, or preferably 500 μm. The diameter of the non-defective mark 38 is set to e.g., 750 μm, or preferably 500 μm. The margin (spacing between the end surface of the peripheral end portion 36 of the metal supporting layer 19 and each of the insulating-base-layer outer peripheral surface 35 and the insulating-cover-layer outer peripheral surface 39) in the exposed peripheral end portion 36 of the metal supporting layer 19 is set to e.g., 100 μm, or preferably 50 μm.

As shown in FIG. 5, the outer frame portion 32 is provided in a circumferentially continuous belt-like shape to surround the opening 29 in the supporting sheet 4. The outer frame portion 32 is formed in a generally equilaterally triangular shape having curved angles when viewed in plan view. The outer frame portion 32 exposes the opening peripheral end portion 40 of the supporting sheet 4 except for the joint portions 33. As shown in FIG. 4, the outer frame portion 32 is formed of the insulating base layer 16 and the insulating cover layer 18.

The insulating base layer 16 of the outer frame portion 32 is formed to correspond to the outer shape of the outer frame portion 32.

The insulating cover layer 18 of the outer frame portion 32 is formed on the insulating base layer 16 to have the same shape as the insulating base layer 16.

The width of the outer frame portion 32 in a direction orthogonal to the circumferential direction thereof is set to e.g., 150 μm, or preferably 100 μm. The margin (spacing between the inner peripheral surface of the outer frame portion 32 and the peripheral end surface of the opening peripheral end portion 40) of the exposed opening peripheral end portion 40 is set to e.g., 100 μm, or preferably 50 μm.

As shown in FIG. 5, the joint portions 33 are provided between the respective middles of the three sides of each of the removal portions 31 out of six sides which face the respective sides of the corresponding outer frame portion 32 and the middles of the three sides of the outer frame portion 32 to couple the removal portion 31 to the supporting sheet 4.

The joint portions 33 are arranged radially around the non-defective mark 38 of the removal portion 31 and, more specifically arranged such that each angle formed between any two adjacent joint portions 33 is 120 degrees when viewed in plan view. Each of the joint portions 33 is formed to traverse the corresponding opening 29 from the removal portion 31 in a direction orthogonal to the circumferential direction of the opening 29 and extend between the removal portion 31 and the outer frame portion 32.

Each of the joint portions 33 is formed of the insulating base layer 16 and the insulating cover layer 18 and provided continuously from the respective insulating base layer 16 and insulating cover layer 18 of the removal portion 31 and the outer frame portion 32 respectively.

The joint portion 33 comprises a removal-portion-side end portion 41 connected to the removal portion 31, a supporting-sheet-side end portion 42 connected to the supporting sheet 4, and a joint middle portion 43 connected therebetween.

The removal portion-side end portion 41 is formed having a curved part which is gradually curved from the joint middle portion 43 toward the removal portion 31 to increase in width to form a wider skirt part.

The supporting-sheet-side end portion 42 is formed having a curved part which is gradually curved from the joint middle portion 43 toward the outer frame portion 32 to increase in width to form a wider skirt part.

The joint middle portion 43 is formed integrally and continuously with the removal-portion-side end portion 41 and the supporting-sheet-side end portion 42 to have a flat belt-like shape having the same width extending between the removal-portion-side end portion 41 and the supporting-sheet-side end portion 42.

The insulating base layer 16 of the joint portion 33 is formed to correspond to the outer shape of the joint portion 33.

The insulating cover layer 18 of the joint portion 33 is formed on the insulating base layer 16 to have the same shape as the insulating base layer 16.

The width of the joint portion 33 in a direction orthogonal to the longitudinal direction of the joint middle portion 43 is set to e.g., 500 μm, or preferably 300 μm. The maximum width of the joint portion 33 at the removal-portion-side end portion 41 and the supporting-sheet-side end portion 42 is set to e.g., 100 μm, or preferably 60 μm.

In the distinguishing mark 3, the region surrounded by the curved part of the outer frame portion 32 having a generally V-shape when viewed in plan view and surrounding the indication vertex 30, by the two joint portions 33 continued to the both ends of the curved part, and by the removal portion 31 interposed between the two joint portions 33 forms an indication region 44 as an indication portion. The indication region 44 is formed in a tapered shape in the indication direction indicating the corresponding wired circuit board 2.

Figure 6:
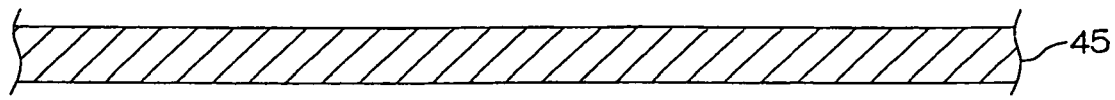
FIG. 6 is a process step diagram showing the steps of producing the wired circuit board assembly sheet, (a) showing the step of preparing a metal supporting board, (b) showing the step of forming a plurality of insulating base layers on the metal supporting board, (c) showing the step of forming a conductive pattern on the insulating base layer of each of the wired circuit boards and forming a mark formation portion on the insulating base layer of each distinguishing marks, and (d) showing the step of forming insulating cover layers on the respective insulating base layers.
Figure 6:
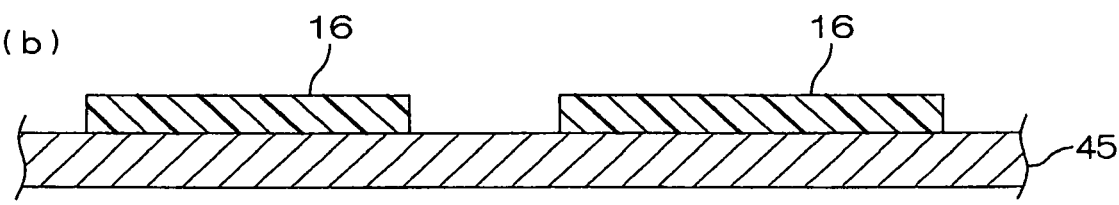
Figure 6:
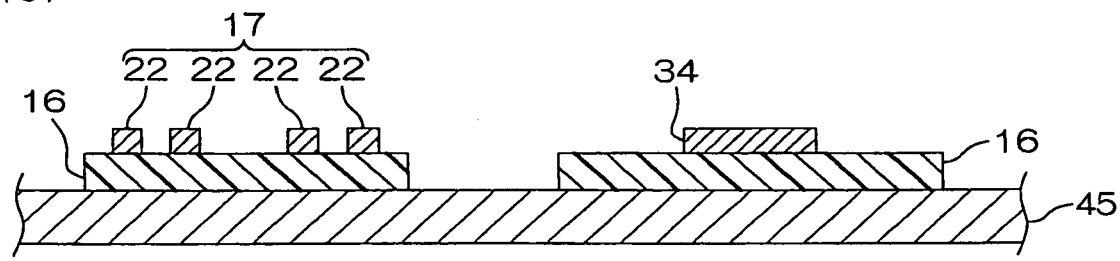
Figure 6:
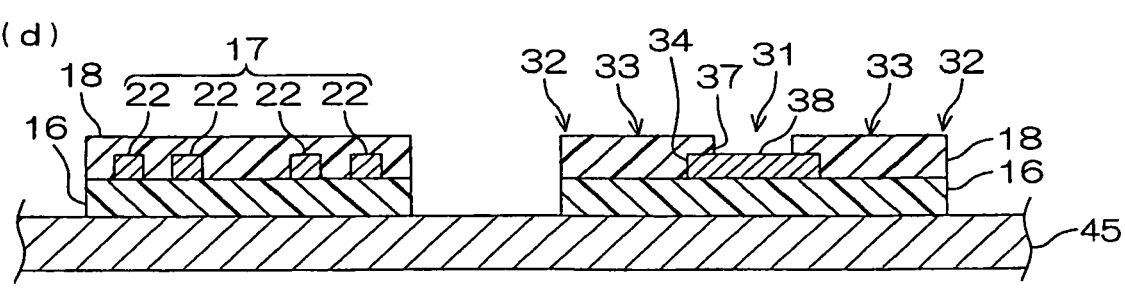
Figure 7:
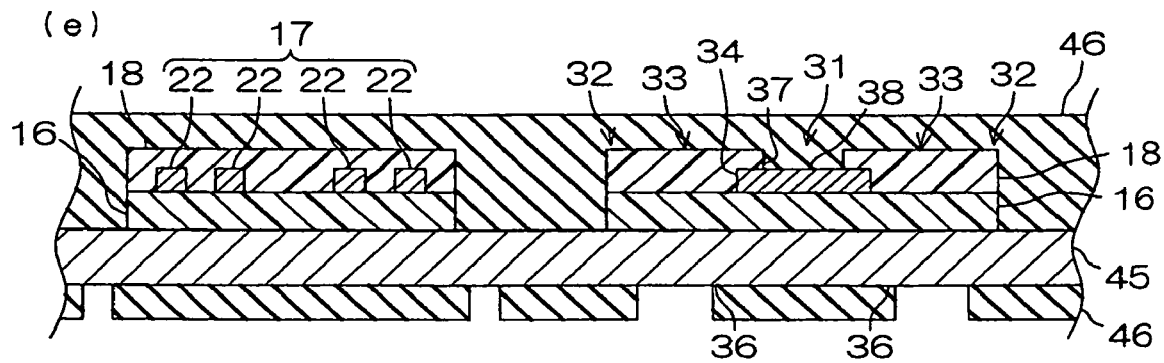
FIG. 7 is a process step diagram showing, subsequently to FIG. 6, the steps of producing the wired circuit board assembly sheet, (e) showing the step of forming an etching resist over the entire surface of the wired circuit board assembly sheet in the midway of production process and forming the etching resist in a predetermined pattern on the back surface thereof, (f) showing the step of opening the metal supporting board exposed from the etching resist by etching, and (g) showing the step of removing the etching resist.
Figure 7:
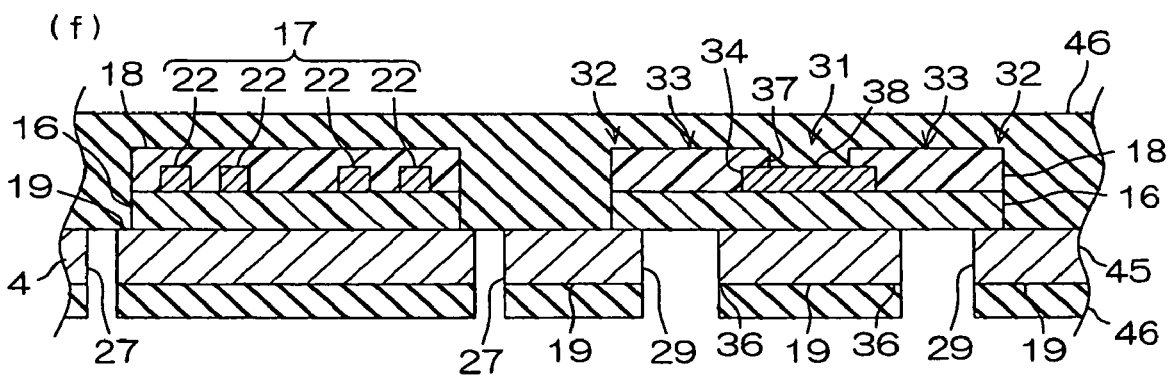
Figure 7:
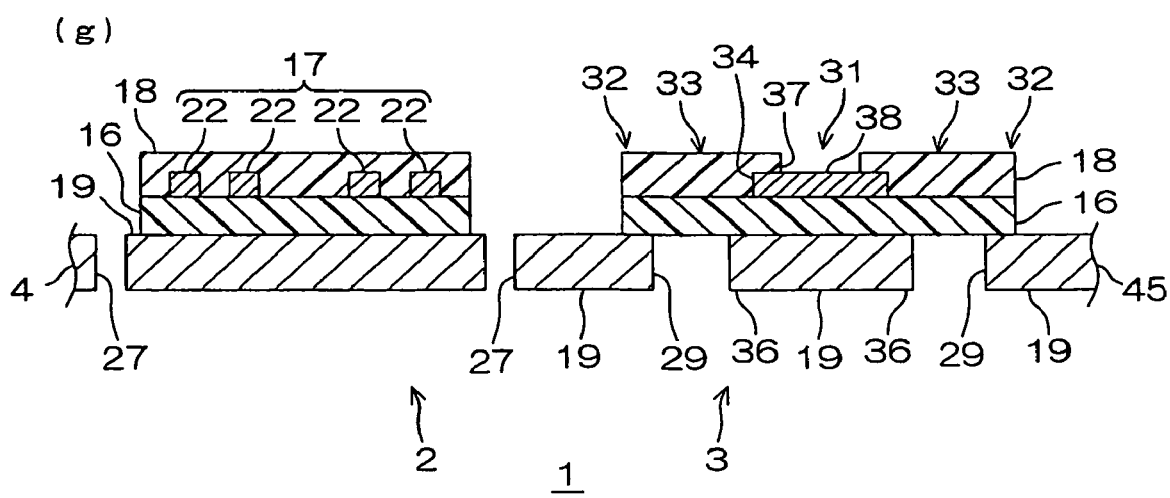

FIGS. 6 and 7 are process step diagrams showing the steps of producing the wired circuit board assembly sheet 1.

Next, a description is given to the method for producing the wired circuit board assembly sheet 1 with reference to FIGS. 6 and 7.

As shown in FIG. 6(a), the metal supporting board 45 is prepared. The metal supporting board 45 is made of a metal thin plate for forming the metal supporting layer 19 and formed in the shape of a generally rectangular flat plate when viewed in plan view, as shown in FIG. 1.

Then, as shown in FIG. 6(b), the plurality of insulating base layers 16 are formed simultaneously in a pattern corresponding to the individual wired circuit boards 2 and the individual distinguishing marks 3 on the metal supporting board 45.

In the formation of each of the insulating base layers 16, a solution (varnish) of a synthetic resin is coated in the foregoing pattern on the surface of the metal supporting board 45, dried, and then heated to be cured as necessary. In the case of using a photosensitive synthetic resin, a photosensitive synthetic resin is coated over the entire surface of the metal supporting board 45. Thereafter, the photosensitive synthetic resin is exposed to light, developed to provide the foregoing pattern, and then heated to be cured as necessary. The formation of the insulating base layer 16 is not limited to the method described above. For example, it is also possible to, e.g., preliminarily form a synthetic resin into a film in the foregoing pattern and then bond the film onto the surface of the metal supporting board 45 via a known adhesive layer.

Then, as shown in FIG. 6(c), the conductive pattern 17 is formed on the insulating base layer 16 of each of the wired circuit boards 2, while the mark formation portion 34 is formed simultaneously on the insulating base layer 16 of each of the distinguishing marks 3 in the pattern corresponding thereto. To form each of the conductive patterns 17 and the mark formation portions 34, a known patterning method such as an additive method or a subtractive method is used, or preferably the additive method is used.

Then, as shown in FIG. 6(d), the insulating cover layers 18 are formed over the respective surfaces of the insulating base layers 16 to cover the respective conductive patterns 17 of the wired circuit boards 2.

More specifically, in each of the wired circuit boards 2, the insulating cover layer 18 is formed on the insulating base layer 16 to expose the first terminal portion 14 and the second terminal portions 15. In each of the distinguishing marks 3, the insulating cover layer 18 is simultaneously formed on the insulating base layer 16 to cover the mark formation portion 34 and expose the non-defective mark 38.

In the formation of each of the insulating cover layers 18, a solution of the synthetic resins described above is coated in the foregoing pattern, dried, and then heated to be cured as necessary. Alternatively, a photosensitive synthetic resin is coated entirely over the metal supporting board 45 and the insulating base layer 16, exposed to light, developed to provide the foregoing pattern, and, then heated to be cured as necessary. The formation of the insulating cover layer 18 is not limited to the method described above. It is also possible to, e.g., preliminarily form a synthetic resin into a film in the foregoing pattern and then bond the film onto the insulating base layer 16 of each of the wired circuit boards 2 and onto the insulating base layer 16 of each of the distinguishing marks 3 each via a known adhesive layer.

Then, as shown in FIGS. 7(e) to 7(g), the opening 29 of each of the distinguishing marks 3 for the wired circuit boards 2 and each of the clearance grooves 27 of the supporting sheet 4 are formed simultaneously by cutting out the metal supporting board 45.

To form the opening 29 of each of the distinguishing marks 3 and each of the clearance grooves 27 of the supporting sheet 4, an etching resist 46 is formed first over the entire top surface of the wired circuit board assembly sheet 1 in the midway of production process, while the etching resist 46 is formed in a pattern reverse to the pattern in which the opening 29 of each of the distinguishing marks 3 and each of the clearance grooves 27 of the supporting sheet 4 on the back surface of the wired circuit board assembly sheet 1 are formed, as shown in FIG. 7(e).

The etching resist 46 is formed in the foregoing pattern by a known photo-process in which, e.g., a dry film photoresist is laminated over the entire top and back surfaces of the wired circuit board assembly sheet 1 in the midway of production process, exposed to light, and then developed.

Then, as shown in FIG. 7(f), the metal supporting board 45 exposed from the etching resist 46 is etched away. The etching is performed by a wet etching (chemical etching) method in which, e.g., an aqueous ferric chloride solution or the like as an etching solution is sprayed onto the metal supporting board 45 or the metal supporting board 45 in the midway of production process is dipped in the etching solution.

Then, as shown in FIG. 7(g), the etching resist 46 is removed by etching or stripping it away.

In this manner, the opening 29 of each of the distinguishing marks 3 and each of the clearance grooves 27 of the supporting sheet 4 can be formed simultaneously and the wired circuit board assembly sheet 1 formed with each of the wired circuit boards 2, each of the distinguishing marks 3, and the supporting sheet 4 can be obtained.

Then, a metal plating layer made of gold or the like not shown is formed on the surfaces of the first terminal portion 14, the second terminal portions 15, and the non-defective mark 38.

Thereafter, in the wired circuit board assembly sheet 1 thus obtained, defectiveness is determined by examining whether or not the conductive pattern 17 of the respective wired circuit board 2 contains a broken wire. The presence or absence of a broken wire in the conductive pattern 17 is determined by optically detecting the contrast between the conductive pattern 17 and the insulating cover layer 18.

Then, the wired circuit board 2 in which a broken wire is detected in the conductive pattern 17 is distinguished as defective. Of the pair of distinguishing marks 3 adjacent to the wired circuit board 2 that is distinguished as defective, the one having the indication region 44 of which the indication direction indicates the wired circuit board 2 is identified through visual observation and the removal portion 31 of the distinguishing mark 3 is removed. For example, when the one wired circuit board 2a in the pair of wired circuit boards 2 is determined as defective, the one distinguishing mark 3a in the pair of distinguishing marks 3 adjacent to the one wired circuit board 2a having the indication region 44 of which the indication direction indicates the one wired circuit board 2a is identified through visual observation and the removal portion 31a of the one distinguishing mark 3a is removed. Of the pair of wired circuit boards 2, when both of the one wired circuit board 2a and the other wired circuit board 2b are determined as defective, the removal portion 31a of the distinguishing mark 3a and the removal portion 31b of the distinguishing mark 3b are both removed. Thus, in this case, both of the removal portions 31 of the distinguishing marks 3 adjacent to each other are removed.

The removal portion 31 is removed by punching using a punch, by stamping using a male or female stamping die or by vacuuming using a vacuum suction device.

In this manner, the wired circuit board 2 that is defective can be identified by visually observing the indication direction of the indication region 44 of the distinguishing mark 3 from which the removal portion 31 is removed. For example, when the removal portion 31a of the one distinguishing mark 3a is removed, it can be recognized that the one wired circuit board 2a is defective by visually observing the indication direction of the indication region 44a thereof.

In the wired circuit board 2 determined as non-defective, the removal portion 31 of the corresponding distinguishing mark 3 remains so that it is possible to recognize that the wired circuit board 2 is non-defective by visually observing the non-defective mark 38 of the removal portion 31.

Thus, in the wired circuit board assembly sheet 1, each of the distinguishing marks 3 for distinguishing defectiveness of the wired circuit boards 2 is formed with the indication region 44. When the distinguishing marks 3 are formed in the wired circuit board assembly sheet 1, the one distinguishing mark 3a is disposed such that the indication direction of the indication region 44a thereof is directed toward the one wired circuit board 2a and the other distinguishing mark 3b is disposed such that the indication region 44b thereof is directed toward the other wired circuit board 2b. This makes it possible to distinctly represent the correspondence between each of the distinguishing marks 3 and each of the wired circuit boards 2. As a result, even when the density of the wired circuit boards 2 in the wired circuit board assembly sheet 1 is high and the pair of wired circuit boards 2 are adjacent to either the one distinguishing mark 3a or the other distinguishing mark 3b, or the one distinguishing mark 3a is adjacent to the other distinguishing mark 3b, the wired circuit board 2 corresponding to each of the distinguishing marks 3 can be easily identified. Therefore, it is possible to reliably remove the removal portion 31 for the wired circuit board 2 determined as defective. In addition, it is possible to prevent the removal portion 31 of the wired circuit board 2 determined as non-defective from being erroneously removed.

Each of the distinguishing marks 3 has a non-point-symmetrical shape, i.e., a generally triangular shape having curved angles. This makes it possible to prevent the indication direction of the indication region 44 and a direction (designated as the quasi-indication direction) which may possibly be the indication direction of the region (indicated as a quasi-indication region 47 by the broken arrow in FIG. 5) surrounding the vertices other than the indication vertex 30 identically to the indication region 44 from overlapping on the same straight line. In other words, it is possible to prevent the quasi-indication direction of the one distinguishing mark 3a from facing downward in the vertical direction of FIG. 1. As a result, it is less likely to misidentify the one wired circuit board 2a corresponding to the one distinguishing mark 3a from being as the other wired circuit board 2b and it is possible to easily and reliably identify the one wired circuit board 2a corresponding to the one distinguishing mark 3a.

Since the indication region 44 has a shape which is tapered toward the indication direction indicating the specified wired circuit board 2, the indication direction of the indication region 44 can be distinctly represented and the wired circuit board 2 corresponding to each of the distinguishing marks 3 can be easily identified.

Since the distinguishing mark 3, more specifically the outer frame portion 32, has a generally triangular shape having an odd number of angles, it is possible to use the part including an arbitrary angle as the indication region 44 and indicate the specified wired circuit board 2 with the indication region 44. In addition, because the distinguishing mark 3 has a generally simple triangular shape, the distinguishing mark 3 can be formed easily.

In the wired circuit board assembly sheet 1, the one distinguishing mark 3a and the other distinguishing mark 3b are arranged in mutually spaced-apart relation in the lateral direction of FIG. 1 and the indication directions of the respective indication regions 44 of the distinguishing marks 3 are vertically reverse to each other. That is, the indication direction of the indication region 44a of the one distinguishing mark 3a faces upward in the vertical direction of FIG. 1, while the indication direction of the indication region 44b of the other distinguishing mark 3b faces downward in the vertical direction of FIG. 1. As a result, when the wired circuit board 2 corresponding to each of the distinguishing marks 3 is identified, it is less likely to confuse the corresponding wired circuit board 2 with another wired circuit board 2 and it is possible to easily identify the wired circuit board 2 corresponding to each of the distinguishing marks 3.

In addition, the openings 29 are formed in the portions (distinguishing mark formation regions 28) of the supporting sheet 4 provided with the distinguishing marks 3 and each of the distinguishing marks 3 comprises the removal portion 31 for indicating defectiveness of the corresponding wired circuit board 2 and the joint portions 33 made of a resin for coupling the removal portion 31 to the supporting sheet 4. As a result, when the removal portion 31 which shows that the wired circuit board 2 is either defective or non-defective is removed, the removal portion 31 can be easily removed from the supporting sheet 4 in the opening 29 by cutting the joint portions 33. Because the joint portions 33 are made of a resin, there is no production of metal powder or the like even when the joint portions 33 are cut so that the wired circuit board 2 is allowed to retain its excellent electric characteristics. Even when punching is performed with a stamping die, the abrasion of the stamping die can be reduced. As a result, it is possible to easily and reliably remove the removal portion 31 to provide the wired circuit board 2 with high connection reliability.

Figure 8:
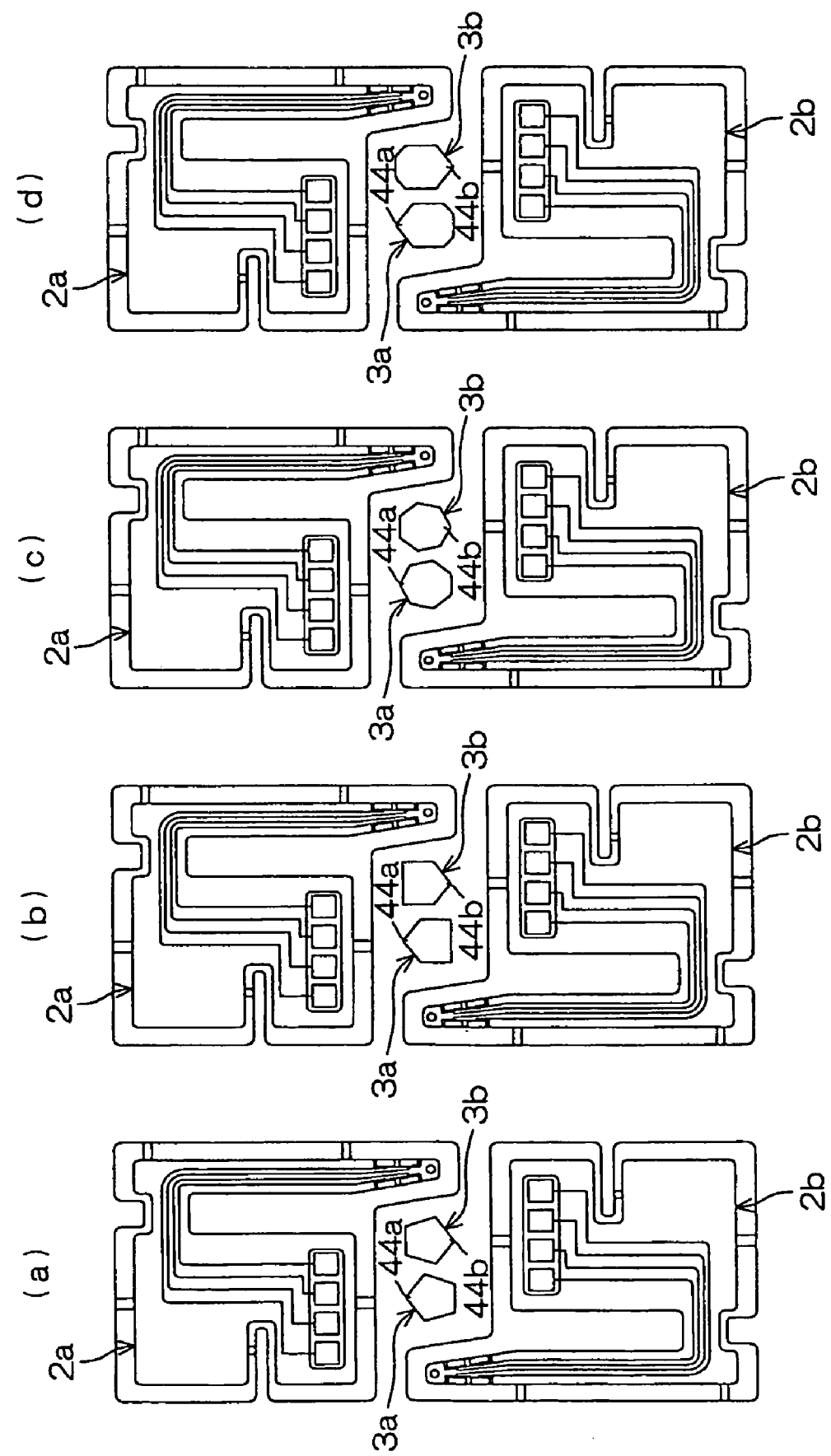
FIG. 8 is a plan view showing a wired circuit board assembly sheet according to other embodiments of the present invention, (a) showing the distinguishing marks each having an equilaterally pentagonal shape when viewed in plan view, (b) showing the distinguishing marks each having a generally pentagonal shape when viewed in plan view (in the shape of a home plate), (c) showing the distinguishing marks each having an equilaterally heptagonal shape when viewed in plan view, and (d) showing the distinguishing marks each having a generally heptagonal shape when viewed in plan view.
Figure 9:
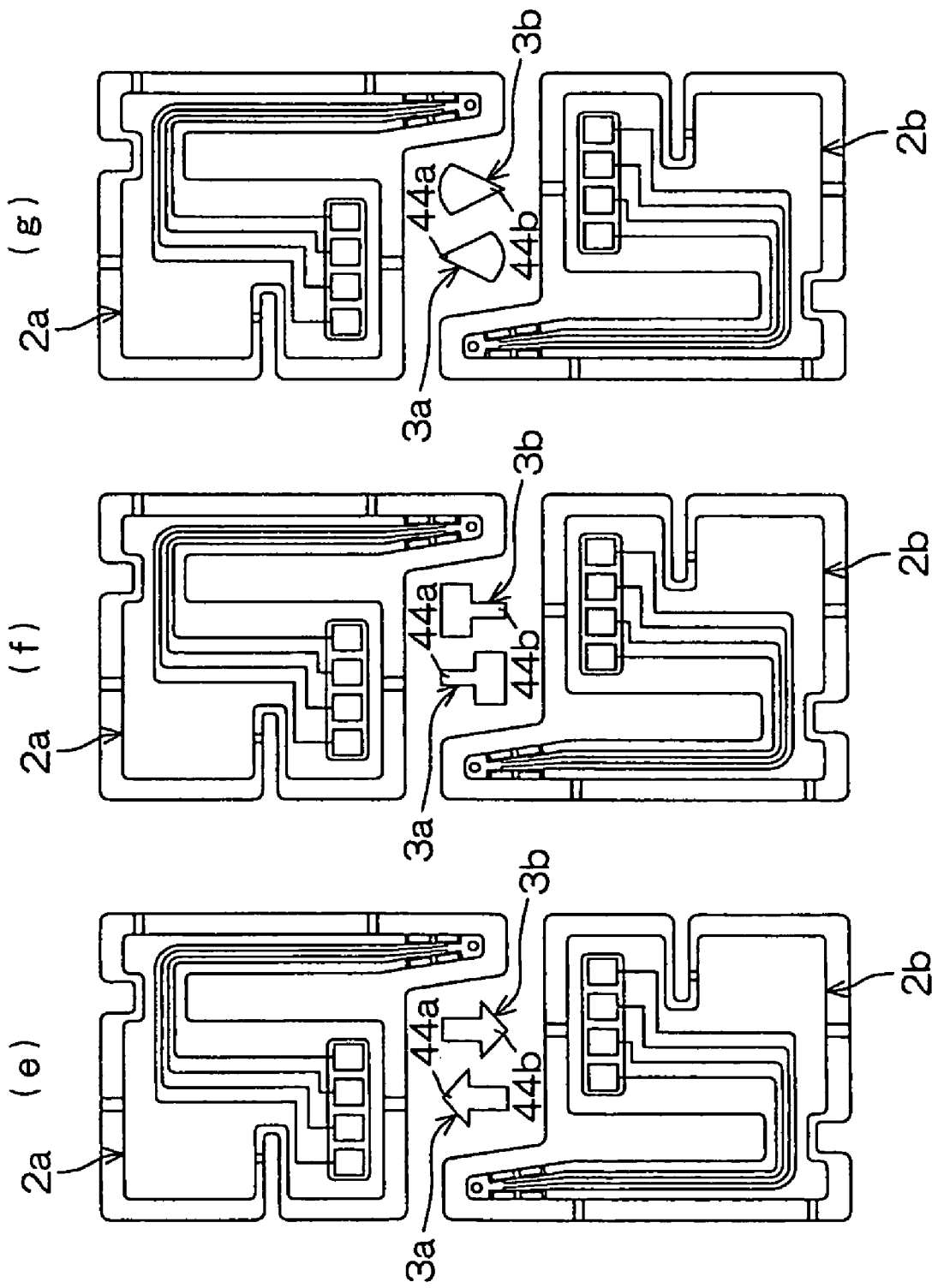
FIG. 9 is a plan view showing a wired circuit board assembly sheet according to still other embodiments of the present invention, (e) showing the distinguishing marks each having an arrow-like shape when viewed in plan view, (f) showing the distinguishing marks each having a convex shape when viewed in plan view, and (g) showing the distinguishing marks each having a sectorial shape when viewed in plan view.

Although the distinguishing mark 3 is formed in a generally equilaterally triangular shape when viewed in plan view in the description given above, the shape of the distinguishing mark 3 is not particularly limited as long as the part which can serve as the indication region 44 for indicating the specified wired circuit board 2 is formed. The distinguishing mark 3 can be formed in, e.g., an equilaterally pentagonal shape when viewed in plan view as shown in FIG. 8(a), a generally pentagonal shape (in the shape of a home plate) when viewed in plan view as shown in FIG. 8(b), an equilaterally heptagonal shape when viewed in plan view as shown in FIG. 8(c), a generally heptagonal shape when viewed in plan view as shown in FIG. 8(d), an arrow-like shape when viewed in plan view as shown in FIG. 9(e), a convex shape when viewed in plan view as shown in FIG. 9(f), a sectorial shape when viewed in plan view as shown in FIG. 9(g), or the like.

Although the removal portion 31 is removed when the wired circuit board 2 is defective in the description given above, the removal portion 31 can also be removed when the wired circuit board 2 is non-defective.

In this case, when the wired circuit board 2 is determined as defective, the removal portion 31 of the distinguishing mark 3 corresponding to the wired circuit board 2 remains and the remaining removal portion 31 confirms that the determination of the wired circuit board 2 is defective.

Although the distinguishing mark 3 is provided with the removal portion 31 and the removal portion 31 is removed when the corresponding wired circuit board 2 is determined as defective (or non-defective) in the embodiments described above, the distinguishing mark 3 need not particularly be provided. It is also possible to, e.g., form the distinguishing mark 3 in a shape in which the indication region 44 is formed after the inspection and form the indication region 44 as a depressed portion in the wired circuit board assembly sheet 1 using a punch or the like or form the indication region 44 as a mark on the wired circuit board assembly sheet 1 with ink.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board assembly sheet comprising:
a plurality of wired circuit boards;
defect-distinguishing marks which distinguish defectiveness of the wired circuit boards; and
a supporting sheet for supporting the plurality of wired circuit boards and the defect-distinguishing marks,
wherein each of the defect-distinguishing marks comprises an indication portion for indicating a specified wired circuit board,
wherein the defect-distinguishing marks are not attached to the wired circuit boards;
wherein each of the defect-distinguishing marks is provided on the supporting sheet in a spaced-apart relation from the specified wired circuit board corresponding to said each defect-distinguishing mark, and the indication portion indicates the specified wired circuit board from external of the specified wired circuit board; and wherein the indication portion has a shape tapered toward an indication direction indicating the specified wired circuit board, so as to distinctly represent a correspondence between a particular defect-distinguishing mark and the specified wired circuit board by directing the indication direction of the indication portion toward the specified wired circuit board to thereby identify a defective wired circuit board from among the plurality of wired circuit boards supported on the supporting sheet.

2. The wired circuit board assembly sheet according to claim 1, wherein each of the defect-distinguishing marks is formed in a non-point-symmetrical shape.

3. The wired circuit board assembly sheet according to claim 1, wherein each of the defect-distinguishing marks has a generally polygonal shape having an odd number of angles.

4. The wired circuit board assembly sheet according to claim 1, wherein the defect-distinguishing marks are arranged in mutually adjacent relation; and wherein the indication portions of the defect-distinguishing marks are arranged in adjacent relation having respective indication directions different from each other.

* * * * *